United States Patent
Polney

(10) Patent No.: US 6,363,017 B2
(45) Date of Patent: Mar. 26, 2002

(54) METHOD AND APPARATUS FOR ALTERNATE OPERATION OF A RANDOM ACCESS MEMORY IN SINGLE-MEMORY OPERATING MODE AND IN COMBINED MULTI-MEMORY OPERATING MODE

(75) Inventor: Jens Polney, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/766,465

(22) Filed: Jan. 19, 2001

(30) Foreign Application Priority Data

Jan. 19, 2000 (DE) .......................... 100 02 130

(51) Int. Cl.$^7$ ................................................ G11C 7/00
(52) U.S. Cl. ............................. 365/189.02; 365/230.03
(58) Field of Search ....................... 365/189.01, 189.02, 365/230.03, 238.5

(56) References Cited

U.S. PATENT DOCUMENTS

| 4,449,207 | A | | 5/1984 | Kung et al. ............ 365/189.02 |
|---|---|---|---|---|
| 5,513,327 | A | | 4/1996 | Farmwald et al. ...... 365/189.02 |
| 5,657,287 | A | * | 8/1997 | McLaury et al. ....... 365/230.03 |
| 5,737,587 | A | | 4/1998 | Leung et al. ................ 713/401 |
| 5,777,608 | A | | 7/1998 | Lipovski et al. ............. 345/519 |
| 5,802,006 | A | * | 9/1998 | Ohta ..................... 365/230.03 |
| 5,959,930 | A | * | 9/1999 | Sakurai .................. 365/230.03 |
| 6,072,949 | A | * | 6/2000 | Nakamura ............... 365/238.5 |
| 6,201,756 | B1 | * | 3/2001 | Lee ........................ 365/232.03 |
| 6,278,643 | B1 | * | 8/2001 | Cowles et al. ......... 365/230.03 |

* cited by examiner

*Primary Examiner*—Tan T. Nguyen
(74) *Attorney, Agent, or Firm*—Herbert L. Lerner; Laurence A. Greenberg; Werner H. Stemer

(57) ABSTRACT

In a random access memory, a sequence of selection signals for a combined multi-memory operating functionality is supplied on control lines which connect the control logic to each memory cell in a cell field when the memory is in a combined multi-memory operating mode, and a sequence of selection signals for the write enable functionality is supplied when the memory is in the single-memory operating mode.

6 Claims, 2 Drawing Sheets

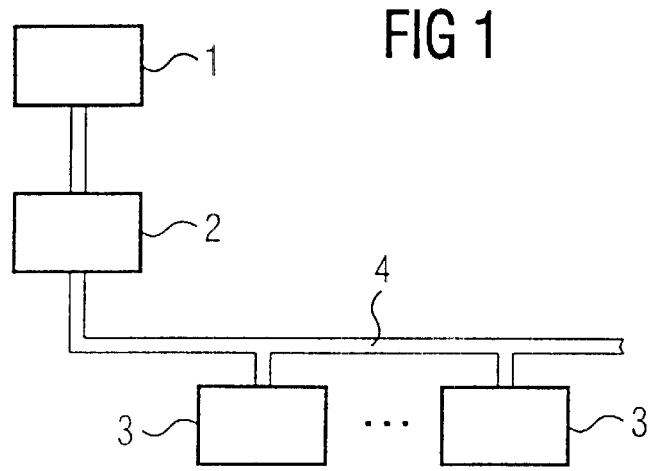
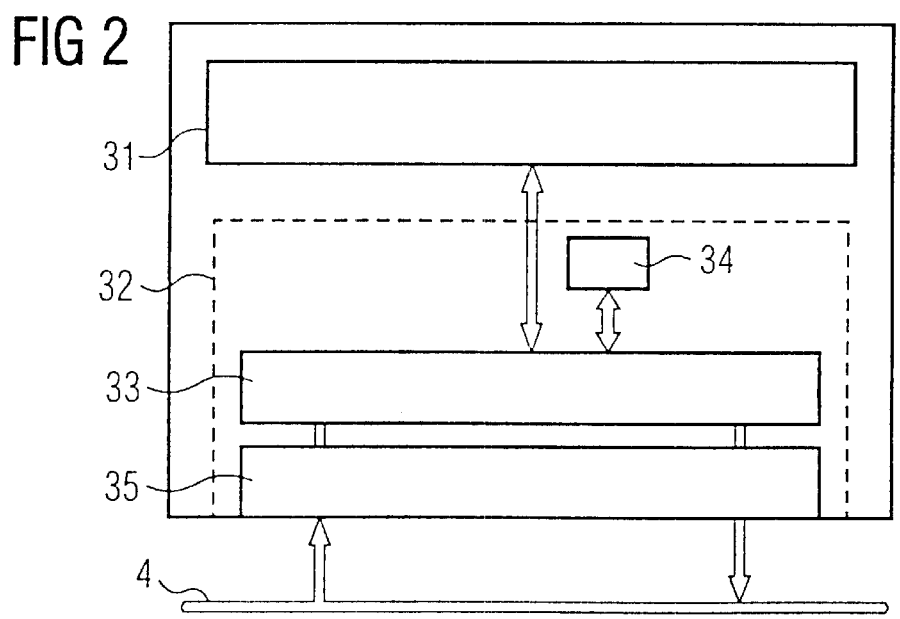
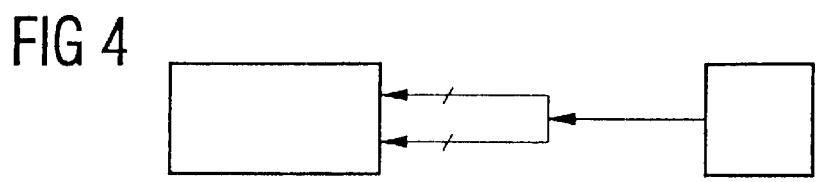

METHOD AND APPARATUS FOR ALTERNATE OPERATION OF A RANDOM ACCESS MEMORY IN SINGLE-MEMORY OPERATING MODE AND IN COMBINED MULTI-MEMORY OPERATING MODE

BACKGROUND OF THE INVENTION

FIELD OF THE INVENTION

The invention relates to a method for alternate operation of a random access memory in the single-memory operating mode and in the combined multi-memory operating mode. The invention also pertains to a correspondingly designed random access memory.

A random access memory (RAM) is a memory in which, once an address has been preset, data can be stored at that address, and can be read from that address. The memory cells in the RAM are thereby arranged in the form of a matrix, with an address being defined by a column and row decoder for selection of a specific memory cell. A word, formed of a number of bits, can then be stored at this address.

By way of example, 256/288 Mbit DRAMs having a word length of 16 or 18 bits are known, under the designation "Direct RDRAM", from the Rambus Company. These DRAMs allow high signal speeds with transmission rates up to 800 MHz. The DRAMs in this case comprise two main blocks, a core block which comprises memory banks and random access amplifiers, and an interface block which allows an external control device to access the core block at a rate of up to 1.6 GB/s. The 32 Mbyte core block of the RDRAM is subdivided into 32 one-Mbyte memory banks, which are each organized in 512 rows. Each row contains 128 memory units, which each contain 16 bytes. These memory units are the smallest data units which can be addressed in the RDRAM. The interface block contains logic for processing and passing on signals to the core block of the RDRAM, and is connected via a high-speed bus to the control device, with the RDRAM being connected to the bus via 18 data pins. The 18 data pins are in this case used for reading and writing data via the bus to the core block, and are multiplexed on two 32-bit or 36-bit data lines, which are operated at ⅛ of the data frequency within the RDRAM. A row of further control pins which connect the interface block to the bus is used to allow the control device to access control registers which contain information about the RDRAM configuration and define the operating mode of the memory. Furthermore, the address of the RDRAM for the control device is stored in the control registers. In addition, address pins are provided on the interface block which control column and row access to the memory cells in the RDRAM. U.S. Pat. No. 5,513,327 describes fundamental features of the Rambus concept.

The RDRAMs are operated in groups of eight memory units via the high-speed bus from the control device, with two different operating modes being provided. In the single-memory operating mode, only one DRAM on the bus in each case ever responds to an instruction from the control device. In this case, column and row address signals are supplied to the respective RDRAM via the address pins. A data transfer then takes place to and from the core block of the respective RDRAM via the 18 data pins. The interface block supplies the core block with a column access pulse CAS and a row access pulse RAS, which define the time conditions for row and column access, respectively, and a read/write signal which determines whether a write or a read operation is intended to be carried out. Write enable functionality (WE functionality) is also provided in the single-memory operating mode, with the interface block being connected via 16 WE control lines, in parallel with the 18 data lines, to the core block in order to output signals to the core block which determine whether a specific bit in a data packet is to be masked, and thus not written to the cell field, when writing to the core block.

In addition to the single-memory operating mode, the RDRAMs can also be operated in the combined multi-memory operating mode. In this operating mode, it is possible for the RDRAMs, which are operated by the control device via the common bus, to output to the bus and to receive from the bus data packets which are interleaved in one another. The interleaved multi-memory operating mode allows a group of eight DRAMs on the bus to respond jointly to an instruction from the control unit. The aim of the interleaved multi-memory operating mode is in this case to limit the number of bits in a data packet which are read from an individual DRAM or are written to it. In the interleaved multi-memory operating mode, a 16-bit or 18-bit long data pack which is output to the bus or is received from the bus respectively comprises two or three bits of the eight actuated DRAMs. This configuration has the advantage that, if successive bits in a data packet are corrupted, this fault, which normally cannot be corrected, is broken down into only one corrupted bit per DRAM in each case, on reception, by deinterleaving of the data word. This 1-bit error can then be corrected by the control device with the aid of error correction software.

The combined multi-memory operating mode (IDM mode) is implemented in the Rambus Company RDRAMs by providing the additional 8 IDM control lines from the interface block to the core block, by means of which control lines the 18 data pins can be actuated individually for reading and writing a data word respectively to and from the core block. The pins are in this case selected by means of an IDM decoder, which contains a 1-bit IDM status signal from the interface block, which signal defines whether the DRAM is in the single-memory operating mode or in the combined multi-memory operating mode, and a 3-bit selection signal which defines the pins for inputting and outputting data to and from the core block. If the IDM status signal indicates the combined multi-memory operating mode to the IDM decoder, this decodes the 3-bit IDM output selection signal in order to write to the core block or to read from the core block via two or three pins of the 18 data lines. In this case, during the write operation, all the pins are masked apart from the pins defined by the IDM decoder. During the read operation, data are transmitted from the core block to the two or three pins which are decoded from the IDM selection signal, while the remaining pins are set to logic zero.

A disadvantage of the combined multi-memory operating functionality implemented by the Rambus Company is the large amount of space required for the additional IDM control lines and the IDM decoder on the DRAM chip.

SUMMARY OF THE INVENTION

The object of the present invention is to provide a random access memory which can be operated alternately in the single-memory operating mode and in the combined multi-memory operating mode and which overcomes the above-noted deficiencies and disadvantages of the prior art devices and methods of this general kind, and which requires a minimum amount of space for the control elements on the chip.

With the above and other objects in view there is provided, in accordance with the invention, a method for alternate operation of a random access memory in single-memory operating mode and in combined or interleaved multi-memory operating mode, which comprises the following method steps:

when an operating mode signal indicates a combined multi-memory operating mode, supplying a sequence of selection signals for a combined multi-memory operating functionality on control lines connecting a control logic to respective memory cells in a cell field; and when the operating mode signal indicates a single-memory operating mode, supplying a sequence of masking signals for a write enable functionality.

In accordance with an added feature of the invention, the operating mode signal is a 1-bit signal.

In accordance with an additional feature of the invention, specific pins of the data lines to the memory cells are masked out with the selection signals for the combined multi-memory operating functionality.

In accordance with another feature of the invention, specific pins of the data line to the memory cells are masked out with the masking signals for the write enable functionality so that bits supplied on the specific pins are not written to the cell field.

With the above and other objects in view there is also provided, in accordance with the invention, a random access memory which comprises:

a cell field with a plurality of memory cells;

a control logic; and control lines connecting the control logic to each the memory cell in the cell field;

the control logic supplying, on the control lines, a sequence of selection signals for a combined multi-memory operating functionality to the memory cells when the memory is in a combined multi-memory operating mode, and supplying a sequence of masking signals for the write enable functionality to the memory cell when the memory is in a single-memory operating mode.

In accordance with a concomitant feature of the invention, a multiplexer unit is connected to the control lines, the multiplexer unit, depending on the operating mode signal, outputting the sequence of selection signals for the combined multi-memory operating functionality and the sequence of masking signals for the write enable functionality on the control lines.

According to the invention, in a random access memory for alternate operation in the single-memory operating mode and in the combined (interleaved) multi-memory operating mode, a sequence of selection signals for a combined multi-memory operating functionality is supplied on control lines which connect control logic to in each case one memory cell in the random access memory when an operating mode signal indicates the combined multi-memory operating mode, and a sequence of masking signals for the write enable functionality is supplied when the operating mode signal indicates the single-memory operating mode.

With the configuration according to the invention, it is possible to use one and the same set of control lines for actuating both the write enable functionality in the single-memory operating mode, in which specific bits in a data word can be masked, and cannot be written to the cell field, when writing to the random access memory and for actuating the combined multi-memory operating functionality, in which specific bits in a data word are unmasked in order to allow a limited data word to be produced with further random access memories. This is possible since simultaneous use of the write enable functionality is not allowed during the combined multi-memory operating functionality of the random access memory. It is thus possible to multiplex the signals of the two modes with one another so that only set of control lines is required, thus achieving a saving in chip area. Thus, in comparison to the DRAMs used by Rambus Company, the use of the already existing WE control lines for the write enable functionality makes it possible to achieve a savings in IDM control lines for the combined multi-memory operating functionality and for the associated IDM decoder.

Other features which are considered as characteristic for the invention are set forth in the appended claims.

Although the invention is illustrated and described herein as embodied in a method and apparatus for alternate operation of a random access memory in the single-memory operating mode, and in the combined multi-memory operating mode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagram of a computer system in which the DRAMs according to the invention are used;

FIG. 2 is a block diagram of a DRAM according to the invention;

FIG. 4 is a block diagram showing multiplexing, according to the invention, of the write enable functionality and the combined multi-memory operating functionality in the DRAM.

DESCRIPTION OF THE PREFERRED EMBODIMENTS

Figure 3:
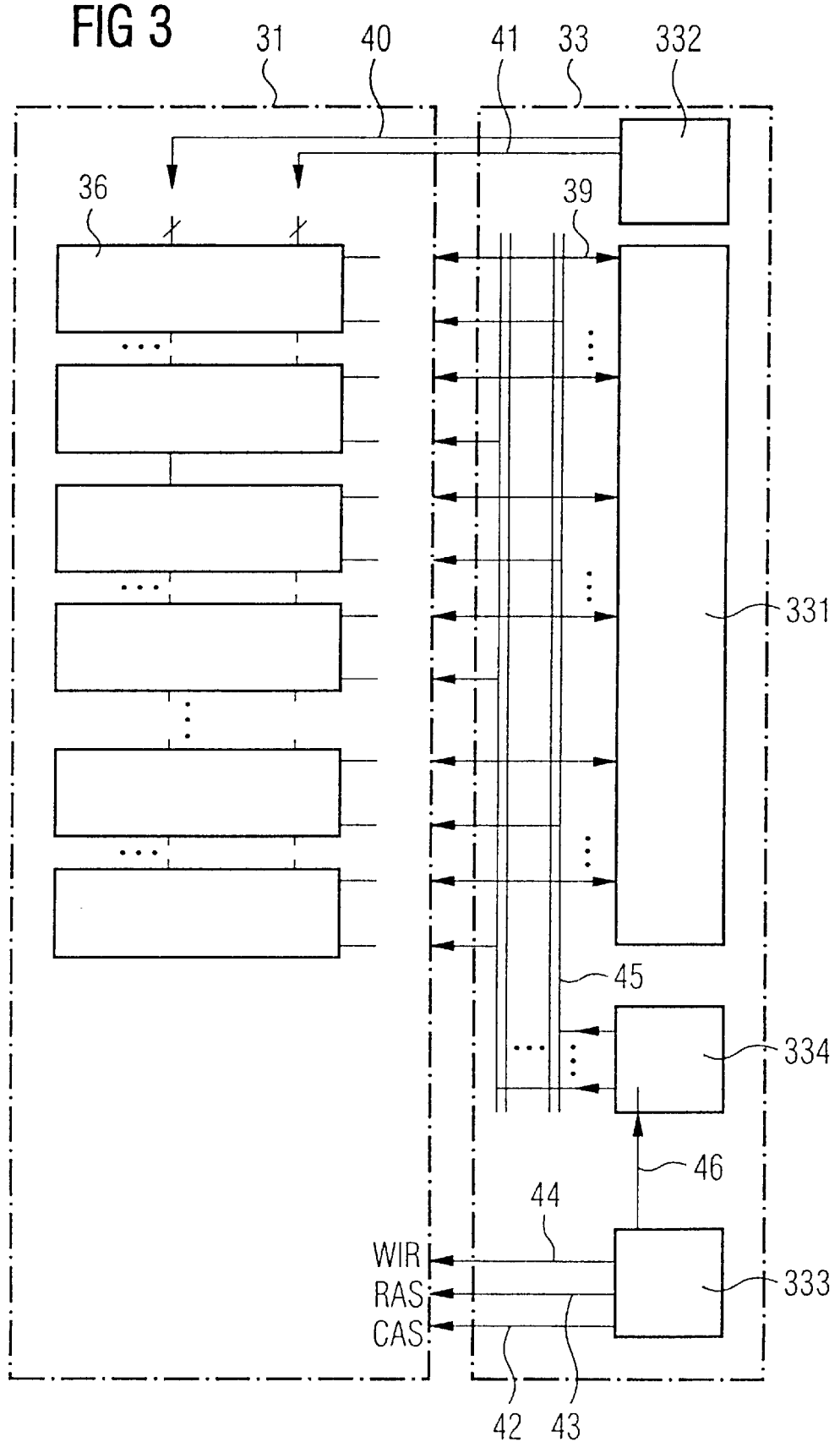
FIG. 3 is schematic block diagram illustrating a connection of the memory area to the interface block for the DRAM according to the invention.

The invention will be explained in the following text with reference to a dynamic random access memory (DRAM). It will be understood, however, that the invention may also be used with other random access memories.

Referring now to the figures of the drawing in detail and first, particularly, to FIG. 1 thereof, there is seen a computer system which has a central processing unit 1, a DRAM control unit 2 and a number of DRAMs 3. The central processing unit 1 emits instructions to the DRAM control unit 2. The DRAM control unit 2 in turn interchanges data with the DRAMs 3 via the high-speed bus 4.

FIG. 2 shows a block diagram of the DRAMs shown in FIG. 1. The DRAM 3 contains a matrix 31 of memory cells, which are organized in banks. An interface block 32 is also provided, and comprises control logic 33 for processing and passing on signals to and from the memory matrix 31. The interface block 32 in turn contains control registers 34, which store control information from the DRAM control unit 2, controlling the operation of the DRAM 3. The interface block 32 is connected via interface pins 35 to the bus 4, with the number of pins depending on the data length of the bus 4 and on the bus protocol which is used by the computer system to which the DRAM is connected.

FIG. 3 shows the data interchange between the memory banks 36 in the memory matrix 31 and the control logic 33 in the interface block 32. The memory banks 36 in the memory matrix 31 are subdivided into data units which can be addressed individually. According to one preferred embodiment, the DRAM is subdivided into 32 1-Mbyte memory banks, which each contain 512 rows, with each row in turn containing 128 data units, whose size is in each case 16 bytes. The memory banks 36 are actuated via non-illustrated read-write amplifiers, which are in turn connected to data lines 39. In the illustrated embodiment, the data transfer in this case preferably takes place via 16 or 18 data lines 39 between the memory banks 36 and a data interchange unit 331 of the control logic 33. The address of the respective data unit to be actuated in the memory banks 36 is in this case defined by an address logic unit 332 in the control logic 33 via the two address control lines 40, 41 for column and row address. A control unit 333 in the control logic 33 supplies, via control lines 42, 43, 44, a column access pulse CAS, a row access pulse RAS and a write/read signal W/R. CAS and RAS are respectively time signals which indicate column access or row access. W/R defines whether a write operation or a read operation is being carried out.

The control logic 33 also has a multiplexer unit 334. This multiplexer unit 334 is connected to the memory matrix 31 via control lines 45. The number of these control lines 45 in this case corresponds to the number of data lines 39. The multiplexer unit 334 is actuated by the control unit 333 by means of an operating mode signal 46. This operating mode signal 46 is preferably a 1-bit signal and defines whether the DRAM is in the single-memory operating mode or in the combined multi-memory operating mode. The single-memory operating mode is preferably indicated by a logic zero while, in contrast, the combined multi-memory operating mode is preferably indicated by a logic one.

In the single-memory operating mode, each DRAM 3 on the bus 4 is actuated separately by the DRAM control unit 2, with a complete data word then always being read from the memory matrix 31, or written to it, via data lines 39. The control lines 45 and the multiplexer unit 334 are used in the single-memory operating mode to output a sequence of masking bits which allow specific bits in a data word to be masked during a write operation to the memory matrix 31 so that they are not written to the cell field.

In the combined multi-memory operating mode, which is signaled to the multiplexer unit 334 by setting the operating mode signal 46 to a logic 1, the multiplexer unit 334 in contrast in each case applies a sequence of selection signals for a combined multi-memory operating functionality to the control lines 45. These selection signals define the pins of the data line on which data are in each case written to or read from the memory matrix 31. This selection process allows a specific number of DRAMs 3 which are connected to the bus 4 to respond simultaneously via the DRAM control unit 2. In the combined multi-memory operating mode, only individual bits of the data packet transmitted on the bus 4 are assigned to each of the DRAMs 3 which are in this way actuated as a group. This ensures that, if there are a number of successive corrupted bits in a data packet transmitted via the bus 4, this fault does not lead to these bits all being assigned to an individual DRAM, which means that they can then no longer be corrected. Since, in the multi-memory operating mode, each data packet on the bus is in each case composed of individual bits of the jointly actuated DRAMs, it is possible if successive bits in a data packet have been corrupted to split this fault into in each case one corrupted bit per DRAM by deinterleaving the data packet, and this can then be corrected with the aid of correction software. The combined multi-memory operating mode thus allows better error correction.

Write enable functionality for the DRAMs 3 is not allowed in the combined multi-memory operating functionality. With the design according to the invention, it is therefore possible to use one and the same set of control lines 45 for actuating the DRAMs 3 with selection signals for the combined multi-memory operating and for actuating the DRAMs 3 with masking signals for the write enable functionality in the single-memory operating mode. The same control signal lines are thus used for transmitting the control instructions. This results in a considerable reduction in the chip area required for the two functionalities. Furthermore, in addition, there is no need to decode the bits to be masked in the combined multi-memory operating mode, and there is thus no need to provide an IDM decoder.

As FIG. 4 shows, the masking signals which are required for the respective functionality are multiplexed directly onto the control lines 45.

In the illustrated embodiment, the DRAM is operated in the combined multi-memory operating mode such that eight DRAMs react simultaneously to an instruction from the control unit. In this case, data are written via the data lines 39 to and read from the memory matrix 31 of the DRAMs 3 via two or three pins, thus resulting in a complete 16-bit or 18-bit data word. This process is then repeated at least seven times, so that all the pins of the eight DRAMs are addressed once and so that one complete data word is in each case written to or read from each individual DRAM.

The features of the invention disclosed in the above description, the drawing and the claims may be of importance both individually and in any given combination for implementation of the various refinements of the invention.

I claim:

1. A method for alternate operation of a random access memory in single-memory operating mode and in combined multi-memory operating mode, which comprises the following method steps:

when an operating mode signal indicates a combined multi-memory operating mode, supplying a sequence of selection signals for a combined multi-memory operating functionality on control lines connecting a control logic to respective memory cells in a cell field; and when the operating mode signal indicates a single-memory operating mode, supplying a sequence of masking signals for a write enable functionality.

2. The method according to claim 1, wherein the operating mode signal is a 1-bit signal.

3. The method according to claim 1, which comprises masking out specific pins of the data lines to the memory cells with the selection signals for the combined multi-memory operating functionality.

4. The method according to claim 1, which comprises masking out specific pins of the data line to the memory cells with the masking signals for the write enable functionality so that bits supplied on the specific pins are not written to the cell field.

5. A random access memory, comprising:

a cell field with a plurality of memory cells;

a control logic; and control lines connecting said control logic to each said memory cell in said cell field;

said control logic supplying, on said control lines, a sequence of selection signals for a combined multi-memory operating functionality to said memory cells when the memory is in a combined multi-memory operating mode, and supplying a sequence of masking signals for the write enable functionality to said memory cell when the memory is in a single-memory operating mode.

6. The random access memory according to claim 5, which further comprises a multiplexer unit connected to said control lines, said multiplexer unit, depending on the operating mode signal, outputting the sequence of selection signals for the combined multi-memory operating functionality and the sequence of masking signals for the write enable functionality on the control lines.

* * * * *